United States Patent [19]
Nakajima

[11] Patent Number: 4,929,944
[45] Date of Patent: May 29, 1990

[54] KEY INPUT APPARATUS
[75] Inventor: Akira Nakajima, Tokyo, Japan
[73] Assignee: NEC Corporation, Tokyo, Japan
[21] Appl. No.: 207,426
[22] Filed: Jun. 16, 1988
[30] Foreign Application Priority Data Jun. 16, 1987 [JP] Japan .................................. 62-150493

[51] Int. Cl.⁵ ............................................. H04B 15/00
[52] U.S. Cl. ......................................... 341/24; 341/25
[58] Field of Search .................... 341/24, 25; 307/542.1
[56] References Cited
U.S. PATENT DOCUMENTS

| | | | |
|---|---|---|---|
| 3,753,007 | 8/1973 | Viswanathan | 341/24 |
| 4,375,036 | 2/1983 | Miller et al. | 307/542.1 |
| 4,392,065 | 7/1983 | Stiglich | 341/24 |
| 4,479,065 | 10/1984 | Aizawa | 307/542.1 |

FOREIGN PATENT DOCUMENTS

| | | | |
|---|---|---|---|
| 2917560 | 11/1980 | Fed. Rep. of Germany | 307/542.1 |
| 0051976 | 4/1977 | Japan | 307/542.1 |
| 0051977 | 4/1977 | Japan | 307/542.1 |
| 0028679 | 2/1980 | Japan | 307/542.1 |

Primary Examiner—Donald J. Yusko
Assistant Examiner—Yuk H. Lau
Attorney, Agent, or Firm—Sughrue, Mion, Zinn, Macpeak & Seas

[57] ABSTRACT

An input key apparatus comprises a keyboard including a plurality of keys and generating key signals when keys are pressed and a key input decoder receiving the key signals from the keyboard for generating decoded key signals. The key input decoder also generates a single key depression signal when a key of the keyboard is pressed one time, and a multi-key depression signal when two or more keys of the keyboard are simultaneously pressed. A chattering prevention circuit receives the single key depression signal and the multi-key depression signal for determining on the basis of the received signals whether or not the key signal received by the decoder is valid, for the purpose of generating a key input valid signal. An output circuit receives the decoded key signals for latching the decoded key signal in response to the key input valid signal.

3 Claims, 6 Drawing Sheets

KEY INPUT APPARATUS

BACKGROUND OF THE INVENTION

1. Field of the Invention

The present invention relates to a key input apparatus, and more specifically to a key input apparatus which receives a key input signal including a chattering or bouncing generated in a mechanical key and can generate an effective key input signal when a key is correctly pressed one time.

2. Description of Related Art

At present, keyboards are widely used as input means for computers and word processors, for example. The keyboards include an array of keys which may be captioned buttons or marked areas on a plane. Each of the keys can generate a discrete signal when it is pressed with a finger. In an actual use, however, the key is not only intentionally and correctly pressed with a finger, but also unintentionally, accidently or improperly pressed. Because of this, hitherto, the keyboards have been associated with a key input circuit for generating a key input signal only when the keys are correctly pressed.

Figure 1:
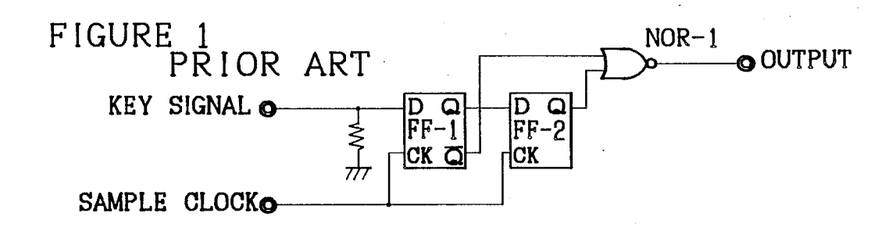
FIG. 1 is a diagram of one example of a conventional key input apparatus.

Referring to FIG. 1, there is shown one example of a conventional key input apparatus, which comprises a D-type flipflop FF-1 having a D input connected to receive a key signal generated when an individual key is pressed. This flipflop FF-1 includes a clock input receiving a sampling clock and a non-inverted output Q of the flipflop FF-1 is connected to a D input of another flipflop FF-2 whose clock input is also connected to receive the same sampling clock. An inverted output $\overline{Q}$ of the flipflop FF-1 and a non-inverted output Q of the flipflop FF-2 are connected to a pair of inputs of a NOR circuit NOR-1, which generates an output signal when the key is correctly pressed.

Figure 2:
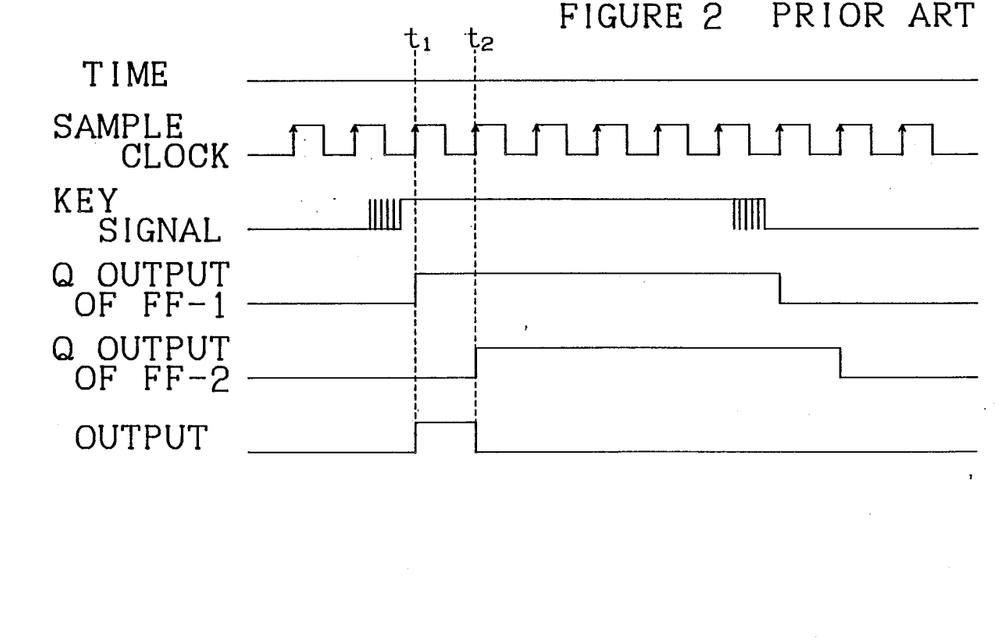
FIG. 2 is a timing chart illustrating an operation of the key input apparatus shown in FIG. 1.

Turning to FIG. 2, there is shown a timing chart illustrating an operation of the key input apparatus shown in FIG. 1. If the key signal is at a high level at a timing $t_1$ in synchronism with a rising edge of the sampling clock, the key signal is latched by the flipflop FF-1. Thereafter, the non-inverted output of the flipflop FF-1 is latched by the flipflop FF-2 at a timing $t_2$ in synchronism with a rising edge of the next sampling clock. Thus, the NOR circuit NOR-1, which receives the inverted output of FF-1 and the non-inverted output of FF-2, generates an output pulse signal having a pulse width starting from the timing $t_1$ and terminating at the timing $t_2$, as shown in FIG. 2.

As illustrated in FIG. 2, when the key is pressed, chattering or bouncing will often occur at a start and an end of the key signal. Now, if the period of the chattering or bouncing is longer than one period of the sampling clock, there is a possibility that it is treated as being two or more depressions although a single depression was intended. This will cause an error operation in computers or word processors. Therefore, the above mentioned key input apparatus will properly operate only when the chattering of the key is shorter than the period of the sampling clock.

SUMMARY OF THE INVENTION

Accordingly, it is an object of the present invention to provide a key input apparatus which has overcome the above mentioned defect of the conventional one.

Another object of the present invention is to provide a key input apparatus which can generate a correct key signal without being influenced by chattering or multi-depression of key.

The above and other objects of the present invention are achieved in accordance with the present invention by a key input apparatus comprising:

a keyboard including a plurality of keys and generating key signals when keys are pressed;

a key input decoder receiving the key signals from the keyboard for generating decoded key signals, the key input decoder generating a single key depression signal when a key of the keyboard is pressed one time, and a multi-key depression signal when two or more keys of the keyboard are simultaneously pressed;

a chattering prevention circuit receiving the single key depression signal and the multi-key depression signal for determining on the basis of the received signals whether or not the key signal received by the decoder is valid, and for generating a key input valid signal; and an output circuit receiving the decoded key signals for latching the decoded key signal in response to the key input valid signal.

In a preferred embodiment of the invention, the input key apparatus comprises:

a keyboard including a plurality of keys and generating key signals when keys are pressed;

a key input decoder receiving the key signals from the keyboard for generating decoded key signals, the key input decoder generating a single key depression signal when a key of the keyboard is pressed one time, and a multi-key depression signal when two or more keys of the keyboard are simultaneously pressed;

a timer cleared in response to an inactive timer start signal and put in operating condition when the timer start signal is made active, for starting its operation in response to an exclusive-OR of the single key depression signal and a key input valid signal to generate a timer out signal after a predetermined time;

a status variable circuit receiving the single key depression signal, the multi-key depression signal and the timer out signal and capable of assuming any one of first to fifth status on the basis of the single key depression signal, the multi-key depression signal and the timer out signal from the timer, the status variable circuit being put in a first condition when the apparatus is powered on, the status variable circuit operating to shift from the first status to a second status if the single key depression signal is made active when it is in the first status, the status variable circuit also operating to return to the first status if the single key depression signal is made inactive before the timer out signal is made active, but to shift to a third status if the timer out signal is made active while the single key depression signal is maintained in the active condition, the status variable circuit also operating to shift to a fourth status if the single key depression signal is made inactive after the circuit is in the third status, the status variable circuit also operating to return to the third status if the single key depression signal is made active before the timer out signal is made active and after the circuit has been put in the fourth status, the timer out signal is made active, but to respond to a variation of the multi-key depression signal, the status variable circuit also operating to shift to the first status if both of the single key depression signal and the multi-key depression signal are made inactive after the active timer out signal is outputted, but to shift to a fifth status if the single key depression signal is made inactive but the multi-key depression signal is active after the active timer out signal is outputted, the status variable circuit also operating to maintain the fifth status until both of the single key depression signal and the multi-key depression signal are made inactive after the circuit has been put in the fifth status, and to thereafter shift to the first status;

an output variable circuit in response to the status of the status variable circuit to inactivate the key input valid signal and the timer start signal when the status variable circuit is in the first status, and to bring the key input valid signal and the timer start signal into an inactive condition and into an active condition, respectively when the status variable circuit is in the second status, the output variable circuit operating to bring the key input valid signal and the timer start signal into an active condition and into an inactive condition, respectively when the status variable circuit is in the third status, and to bring both of the key input valid signal and the timer start signal into an active condition when the status variable circuit is in the fourth status, the output variable circuit operating to bring both of the key input valid signal and the timer start signal into an inactive condition when the status variable circuit is in the fifth status; and an output circuit receiving the decoded key signals for latching the decoded key signal in response to the key input valid signal.

The above and other objects, features and advantages of the present invention will be apparent from the following description of preferred embodiments of the invention with reference to the accompanying drawings.

DESCRIPTION OF THE PREFERRED EMBODIMENTS

Figure 3:
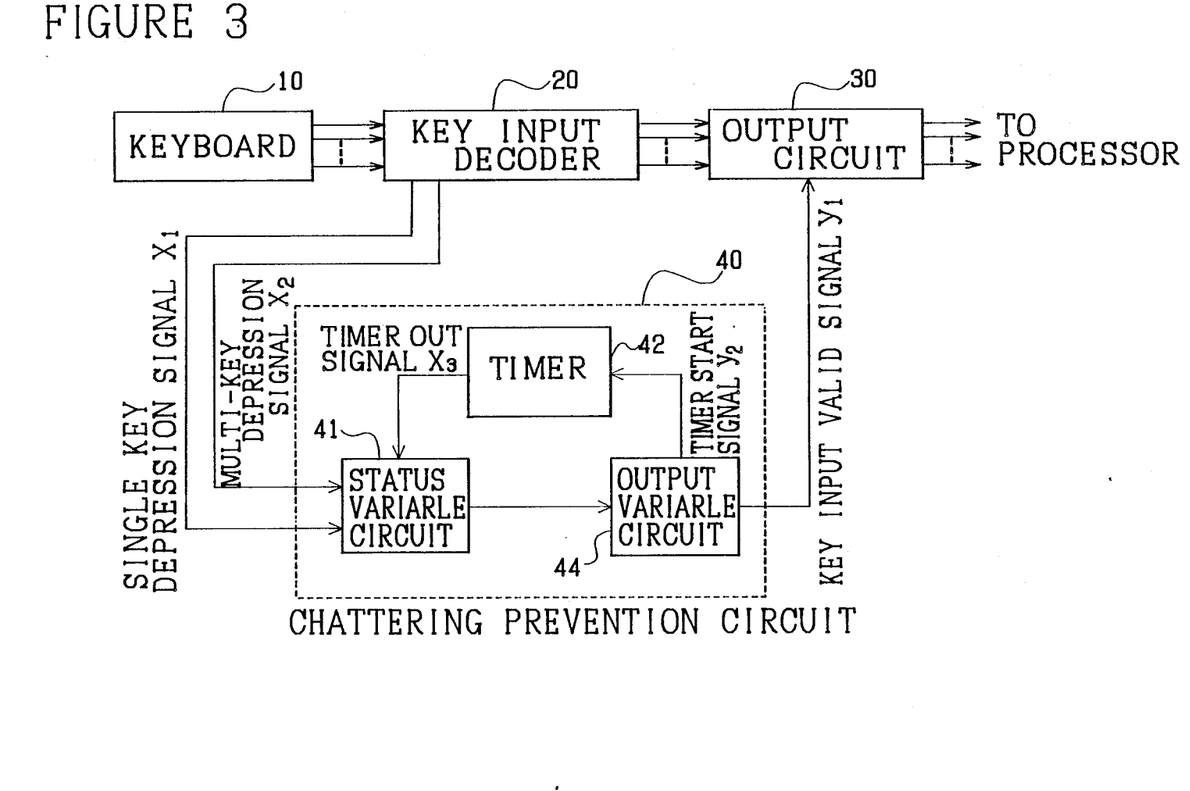
FIG. 3 is a block diagram of one embodiment of the key input apparatus in accordance with the present invention.

Referring to FIG. 3, there is shown a diagram of one embodiment of the key input apparatus in accordance with the present invention. The shown key input apparatus includes a keyboard 10 generating key signals when individual keys are pressed, and a key input decoder 20 receiving the key signals from the keyboard 10 for generating decoded key signals in the format of a parallel binary code to an output circuit 30. In addition, when a key of the keyboard 10 is pressed one time, the key input decoder 20 generates a single key depression signal $x_1$, and when two or more keys of the keyboard 10 are simultaneously pressed, the decoder 20 generates a multi-key depression signal $x_2$. The single key depression signal $x_1$ and the multi-key depression signal $x_2$ are supplied to a chattering prevention circuit 40, which in turn determines on the basis of the received signals whether or not the key signal received by the decoder 20 is valid, and then generates a key input valid signal $y_1$ to the output circuit 30 when the key signal is deemed to be valid. When the key input valid signal $y_1$ is activated, the output circuit 30 latches the decoded key signal from the decoder 20, and outputs the latched signals to an input circuit of a processor not shown.

The chattering prevention circuit 40 includes a status variable circuit 41 receiving the single key depression signal $x_1$ and the multi-key depression signal $x_2$ and also receives a timer out signal $x_3$ form a timer 42. A status output of the status variable circuit 41 is coupled to an output status circuit 44, which in turn outputs a timer start signal $y_2$ to the timer 42 and also generates the key input valid signal $y_1$. The status variable circuit 41 and the output variable circuit 44 have a plurality of items of status, respectively, and assume one of the items of status in response to the received signals, respectively.

In the above mentioned apparatus, when the key signal is inputted to the decoder 20, if the single key depression signal x1 is activated and maintained in the activated condition until a timer out signal is outputted from the timer 42, the status variable circuit 41 assumes one predetermined status which causes the output variable circuit 44 to output the key input valid signal $y_1$. Therefore, any influence by the chattering and the multi-depression is prevented. After the status variable circuit 41 assumes the above predetermined status, it can assume another predetermined status allowing to return to an initial status after key signal is made inactive so that it is not influenced by the chattering or multidepression occurring when the pressed key is released.

Figure 4:
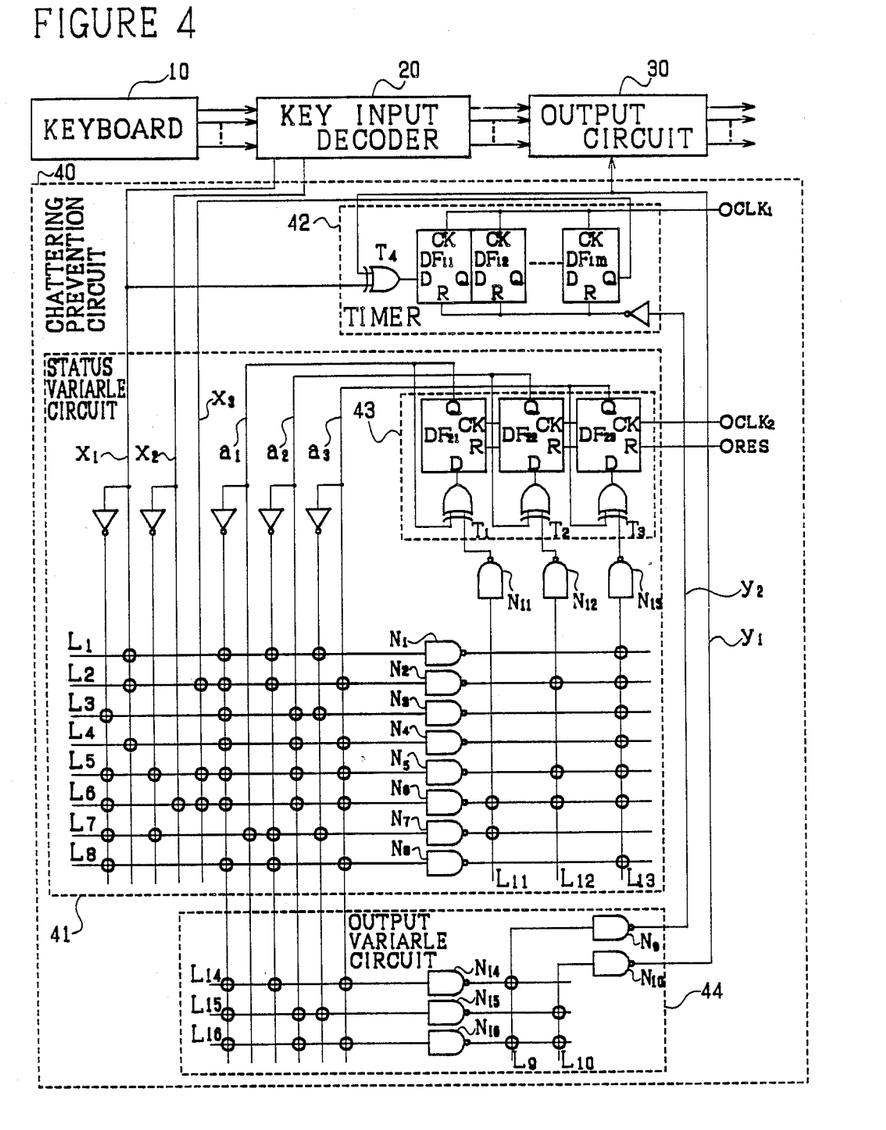
FIG. 4 is a detailed block diagram of the key input apparatus shown in FIG. 3.

Turning to FIG. 4, there is shown a detailed circuit of the chattering prevention circuit 40. The status variable circuit 41 includes a toggle flipflop circuit 43 for generating three status signal $a_1$, $a_2$ and $a_3$. In the embodiment shown in FIG. 4, the single key depression signal $x_1$, and the multi-key depression signal $x_2$, assume respective logic levels indicated in the following TABLE 1 under conditions indicated in the same TABLE 1.

TABLE 1

| SINGLE DEPRESSION KEY SIGNAL $x_1$ | MULTI-DEPRESSION KEY SIGNAL $x_2$ | CONDITION FOR GENERATION OF $x_1$ AND $x_2$ |
|---|---|---|
| 0 | 0 | NO DEPRESSION (KEY IS NOT PRESSED) |
| 0 | 1 | MULTI-DEPRESSION (KEY IS PRESSED TWICE OR MORE) |
| 1 | 0 | SINGLE DEPRESSION (KEY IS PRESSED ONCE) |
| 1 | 1 | — |

The single key depression signal $x_1$, the multi-key depression signal $x_2$, the timer out signal $x_3$ and the status signal $a_1$, $a_2$ and $a_3$ and inverted signals of the single key depression signal $x_1$, the multi-key depression signal $x_2$, and the status signal $a_1$, $a_2$ and $a_3$ are connected to eight lines $L_1$ to $L_8$ at connection nodes indicated by small circles in the drawing. The eight line $L_1$ to $L_8$ are connected to eight single-input NAND circuits $N_1$ to $N_8$, respectively.

Figure 5:
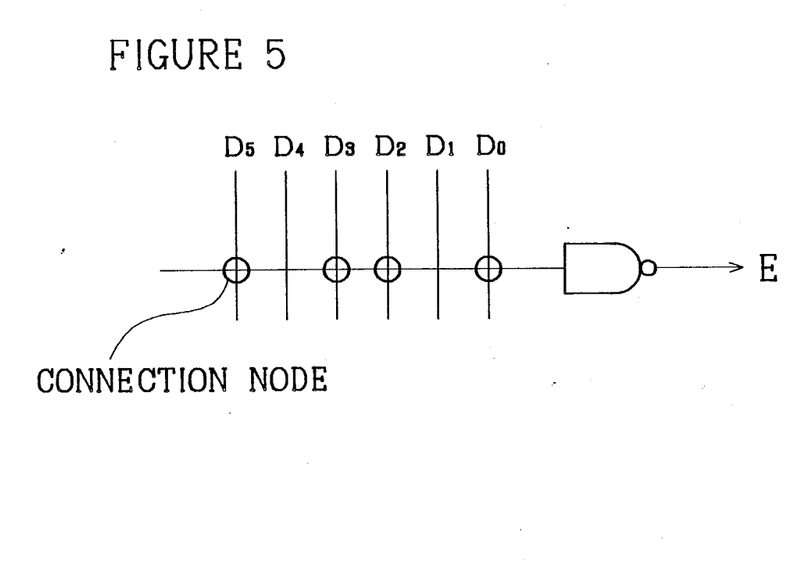
FIG. 5 is a logic circuit diagram of the wired NAND circuit used in the circuit shown in FIG. 4.

Here, referring to FIG. 5, there is shown a single-input NAND circuit having an input line connected to data lines $D_0$, $D_2$, $D_3$ and $D_5$ of data lines $D_0$ to $D_5$. In this circuit, if all the data lines $D_0$, $D_2$, $D_3$ and $D_5$ are at a logic level "1" (simply called "1" hereinafter), an output of the single-input NAND circuit assumes a logic level "0" (simply called "0" hereinafter). Otherwise, the single-input NAND circuit outputs a signal of "1". Namely, the single-input NAND circuit forms a NAND circuit having inputs $D_0$, $D_2$, $D_3$ and $D_5$. Therefore, it can be understood that each of the single-input NAND circuits $N_1$ to $N_8$ forms a multi-input NAND circuit having inputs formed by the connection nodes on the associated line $L_1$ to $L_8$.

Outputs of the single-input NAND circuits $N_1$ to $N_8$ are connected to another set of lines $L_{11}$ to $L_{13}$ at connection nodes indicated by small circles in drawing, respectively. These lines $L_{11}$ to $L_{13}$ are connected to three single-input NAND circuits $N_{11}$ to $N_{13}$, which respectively form multi-input NAND circuits having inputs formed by the connection nodes on the associated line $L_{11}$ to $L_{13}$.

The toggle flipflop circuit 43 includes three exclusive-OR circuits $T_1$ to $T_3$, which have their first inputs connected to receive respective outputs of the three single-input NAND circuits $N_{11}$ to $N_{13}$. Each of the exclusive-OR circuits $T_1$ to $T_3$ is connected at its output to a D-input of corresponding D-type flipflops $DF_{21}$ to $DF_{23}$. Non-inverted outputs Q of the D-type flipflops $DF_{21}$ to $DF_{23}$ generate the above mentioned status signal $a_1$, $a_2$ and $a_3$, respectively, and also connected to second inputs of the associated exclusive-OR circuits $T_1$ to $T_3$. In addition, all of the three exclusive-OR circuits $T_1$ to $T_3$ are connected to receive a clock signal $CLK_2$ and a reset signal RES at their clock inputs and reset inputs, respectively.

The output variable circuit 44 includes three lines $L_{14}$ to $L_{16}$ connected to the status signal $a_1$, $a_2$ and $a_3$ and their inverted signals at connection nodes indicated by small circles in drawing, respectively. These lines $L_{14}$ to $L_{16}$ are connected to three single-input NAND circuits $N_{14}$ to $N_{16}$, which respectively form multi-input NAND circuits having inputs formed by the connection nodes on the associated line $L_{14}$ to $L_{16}$. Outputs of the single-input NAND circuits $N_{14}$ to $N_{16}$ are connected to a pair of lines $L_9$ and $L_{10}$ at connection nodes indicated by small circles in drawing, respectively. These lines $L_9$ and $L_{10}$ are connected to a pair of single-input NAND circuits $N_9$ and $N_{10}$, which respectively form multi-input NAND circuits having inputs formed by the connection nodes on the associated line $L_9$ and $L_{10}$. The NAND circuit $N_{10}$ generates at its output the above mentioned key input valid signal $y_1$, which assumes, in this embodiment, assumes respective logic levels indicated in the following TABLE 2 under conditions indicated in the same TABLE 2. The NAND circuit $N_9$ generates at its output the above mentioned timer start signal $y_2$, which assumes, in this embodiment, respective logic levels indicated in the following TABLE 3 under conditions indicated in the same TABLE 3.

TABLE 2

| KEY INPUT VALID OUTPUT SIGNAL $y_1$ | KEY INPUT DECISION |
|---|---|
| 0 | INVALID |
| 1 | VALID |

TABLE 3

| TIMER START SIGNAL $y_2$ | CONTENT OF CONTROL |
|---|---|
| 0 | RESET TIMER 42 |
| 1 | START TIMER 42 |

The key input valid signal $y_1$ and the single key depression signal $x_1$ are supplied to inputs of an exclusive-OR circuit $T_4$ of the timer 42. An output of the exclusive-OR circuit $T_4$ is connected to a D-input of a first stage of a cascaded D-type flipflops $DF_{11}$ to $DF_{1m}$, each of which has a clock input connected to receive a clock signal $CLK_1$ and a reset input connected to receive through an inverter the output of the NAND circuit $N_9$, namely, the timer start signal $y_2$. An output of the last stage of the cascaded D-type flipflops $DF_{11}$ to $DF_{1m}$ generates the above mentioned timer out signal $x_3$. Now, assuming that the number of the cascaded D-type flipflops $DF_{11}$ to $DF_{1m}$ is "m" and one period of the clock signal $CLK_1$ is "p", a time $t_{ms}$ from the moment the timer 42 starts its counting operation in response to the timer start signal $y_2$ to the moment the timer 42 generates the timer out signal $x_3$ is expressed by "m.p". In this embodiment, The timer out signal $x_3$ assumes respective logic levels indicated in the following TABLE 4 under conditions indicated in the same TABLE 4.

TABLE 4

| TIMER OUT SIGNAL $x_3$ | STATUS AFTER START OF TIMER 42 |
|---|---|
| 0 | BEFORE $t_{ms}$ |
| 1 | AFTER $t_{ms}$ |

Figure 6:
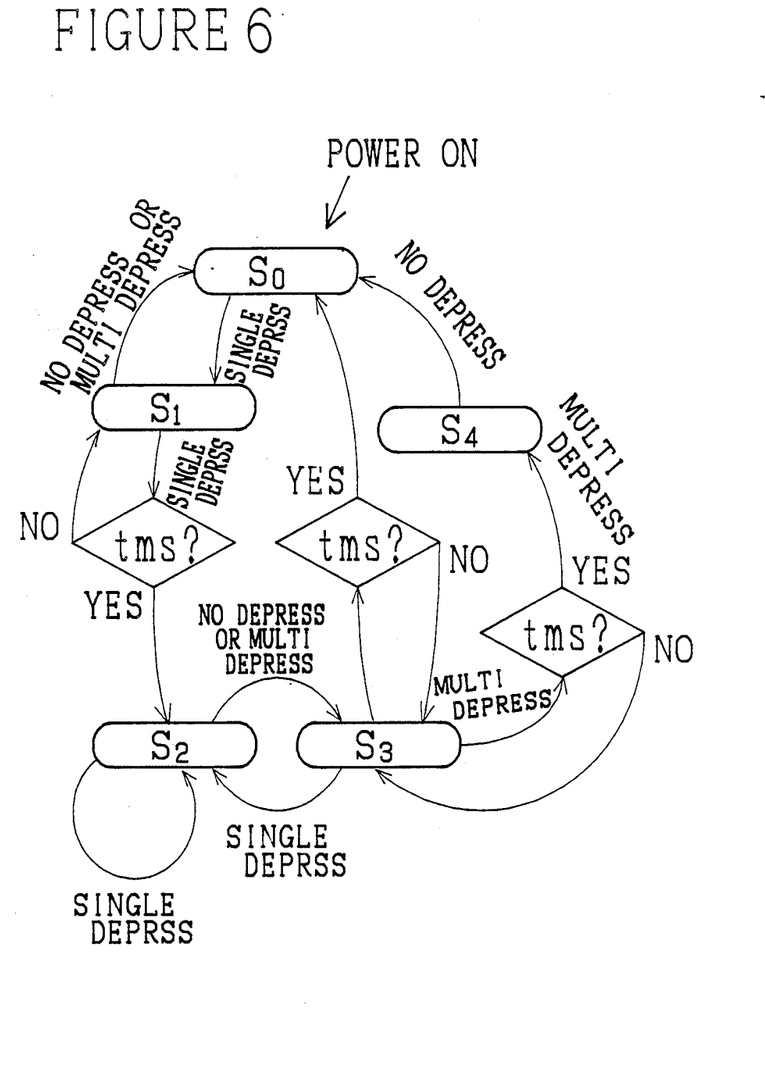
FIG. 6 is a flow chart illustrating an operation of the apparatus shown in FIG. 4.
Figure 7:
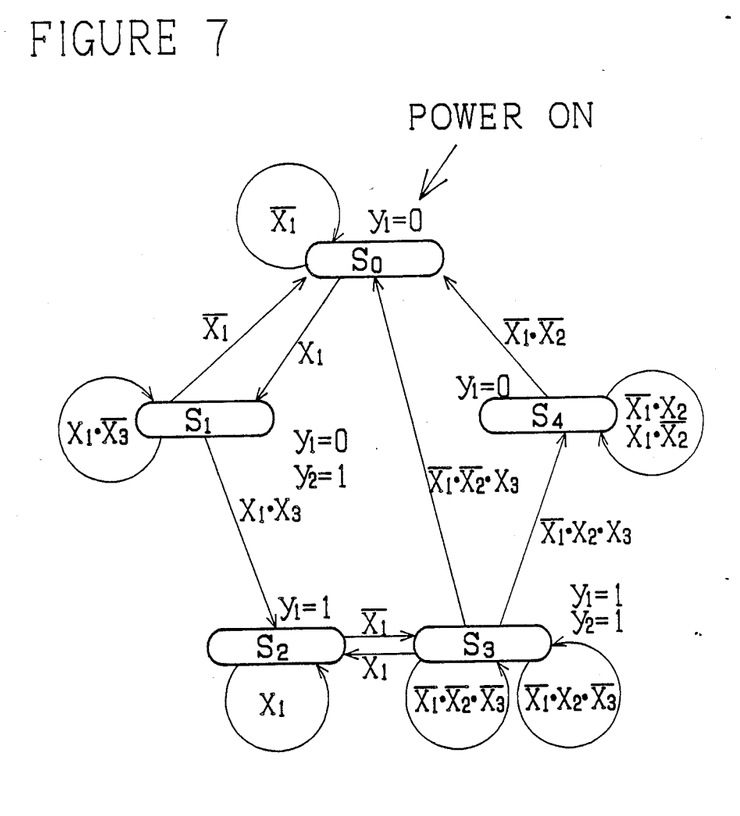
FIG. 7 is a chart illustrating a status transition in the operation of the apparatus shown in FIG. 4.

Now, operation of the input key apparatus having the construction as explained above will be described with reference to FIGS. 6 and 7 and TABLES 5 and 6. FIG. 6 is a flow chart illustrating an operation of the apparatus shown in FIG. 4, and FIG. 7 is a chart illustrating a status transition in the operation of the apparatus shown in FIG. 4. TABLE 5 indicates the status of the respective elements in the status transitions shown in FIG. 7. In TABLE 5, "-" means "DO'NT CARE". TABLE 6 illustrates the relation between status and the outputs of the chattering prevention circuit 40.

TABLE 5

| TRANSITION TRSj | INPUT OF CHATTERING PREVENTION CIRCUIT 40 | | OUTPUT OF TIEMR 42 | INPUT OF TOGGLE FLIPFLOP CIRCUIT 43 | | | CURRENT STATUS OF OUTPUT OF CHATTERING PREVENTION CIRCUIT 40 | | | | NEXT STATUS OF OUTPUT OF CHATTERING PREVENTION CIRCUIT 40 | | | |
|---|---|---|---|---|---|---|---|---|---|---|---|---|---|---|
| J | $x_1$ | $x_2$ | $x_3$ | $T_1$ | $T_2$ | $T_3$ | Si | $a_1$ | $a_2$ | $a_3$ | Si | $a_1$ | $a_2$ | $a_3$ |
| 0 | 0 | — | — | 0 | 0 | 0 | $S_0$ | 0 | 0 | 0 | $S_0$ | 0 | 0 | 0 |
| 1 | 1 | — | — | 0 | 0 | 1 | $S_0$ | 0 | 0 | 0 | $S_1$ | 0 | 0 | 1 |
| 2 | 0 | — | — | 0 | 0 | 1 | $S_1$ | 0 | 0 | 1 | $S_0$ | 0 | 0 | 0 |
| 3 | 1 | — | 0 | 0 | 0 | 0 | $S_1$ | 0 | 0 | 1 | $S_1$ | 0 | 0 | 1 |
| 4 | 1 | — | 1 | 0 | 1 | 1 | $S_1$ | 0 | 0 | 1 | $S_2$ | 0 | 1 | 0 |
| 5 | 1 | — | — | 0 | 0 | 0 | $S_2$ | 0 | 1 | 0 | $S_2$ | 0 | 1 | 0 |
| 6 | 0 | — | — | 0 | 0 | 1 | $S_2$ | 0 | 1 | 0 | $S_3$ | 0 | 1 | 1 |
| 7 | 0 | 0 | 0 | 0 | 0 | 0 | $S_3$ | 0 | 1 | 1 | $S_3$ | 0 | 1 | 1 |
| 8 | 0 | 1 | 0 | 0 | 0 | 0 | $S_3$ | 0 | 1 | 1 | $S_3$ | 0 | 1 | 1 |

TABLE 5-continued

| TRANSITION TRSj | INPUT OF CHATTERING PREVENTION CIRCUIT 40 | | | OUTPUT OF TIEMR 42 | INPUT OF TOGGLE FLIPFLOP CIRCUIT 43 | | | CURRENT STATUS OF OUTPUT OF CHATTERING PREVENTION CIRCUIT 40 | | | | NEXT STATUS OF OUTPUT OF CHATTERING PREVENTION CIRCUIT 40 | | | |
|---|---|---|---|---|---|---|---|---|---|---|---|---|---|---|---|
| J | $x_1$ | $x_2$ | $x_3$ | | $T_1$ | $T_2$ | $T_3$ | Si | $a_1$ | $a_2$ | $a_3$ | Si | $a_1$ | $a_2$ | $a_3$ |
| 9 | 1 | — | — | | 0 | 0 | 1 | $S_3$ | 0 | 1 | 1 | $S_2$ | 0 | 1 | 0 |
| 10 | 0 | 0 | | 1 | 0 | 1 | 1 | $S_3$ | 0 | 1 | 1 | $S_0$ | 0 | 0 | 0 |
| 11 | 0 | 1 | | 1 | 1 | 1 | 1 | $S_3$ | 0 | 1 | 1 | $S_4$ | 1 | 0 | 0 |
| 12 | 0 | 1 | — | | 0 | 0 | 0 | $S_4$ | 1 | 0 | 0 | $S_4$ | 1 | 0 | 0 |
| 13 | 1 | 0 | — | | 0 | 0 | 0 | $S_4$ | 1 | 0 | 0 | $S_4$ | 1 | 0 | 0 |
| 14 | 0 | 0 | — | | 1 | 0 | 0 | $S_4$ | 1 | 0 | 0 | $S_0$ | 0 | 0 | 0 |

TABLE 6

| STATUS Si OF CHATTERING PREVENTION CIRCUIT 40 | | | | OUTPUT OF OUTPUT VARIABLE CIRCUIT 44 | |
|---|---|---|---|---|---|
| Si | $a_1$ | $a_2$ | $a_3$ | $y_1$ | $y_2$ |
| $S_0$ | 0 | 0 | 0 | 0 | 0 |
| $S_1$ | 0 | 0 | 1 | 0 | 1 |
| $S_2$ | 0 | 1 | 0 | 1 | 0 |
| $S_3$ | 0 | 1 | 1 | 1 | 1 |
| $S_4$ | 1 | 0 | 0 | 0 | 0 |

When the chattering prevention circuit 40 is powered on, since the timer start signal $y_2$ is of "0", all of the D-type flipflop $DF_{11}$ to $DF_{1m}$ are reset so as to output the timer out signal $x_3$ of "0". On the other hand, all of the D-type flipflop $DF_{21}$ to $DF_{23}$ of the toggle flipflop circuit 43 are reset by the reset signal RES so as to initialize the status signal $a_1$, $a_2$ and $a_3$ to "0", namely to a status $S_0$ (Transition $TRS_0$ of TABLE 5).

If one key of the keyboard 10 is pressed, the single key depression signal $x_1$ is brought into "1" and therefore, $x_1 \cdot \overline{a_1} \cdot \overline{a_2} \cdot \overline{a_3}$ is made to "1". Accordingly, the NAND circuit $N_1$ of the NAND circuits $N_1$ to $N_8$ generates the output of "0". In response to this situation, the NAND circuit $N_{13}$ of the NAND circuits $N_{11}$ to $N_{13}$ generates the output of "1". Therefore, the inputs $T_1$, $T_2$ and $T_3$ of the toggle flipflop circuit 43 receives an input pattern of "0", "0" and "1", so that status signal $a_1$, $a_2$ and $a_3$ are changed from the pattern of "0", "0" and "0" to a pattern of "0", "0" and "1". Namely, the circuit is transited to the status $S_1$ (Transition $TRS_1$).

After it is put in the status $S_1$, if the single key depression signal $x_1$ becomes "0" before the timer out signal $x_3$ is brought into "1", it is returned to status $S_0$ (Transition $TRS_2$).

After it is put in the status $S_1$, if the single key depression signal $x_1$ does not become "0", the NAND circuit $N_{14}$ of the NAND circuits $N_{14}$ to $N_{16}$ generates the output of "0" since $\overline{a_1} \cdot \overline{a_2} \cdot a_3$ of the status variable circuit 41 are of "1", respectively. Thus, the NAND circuit $N_9$ of the output variable circuit 44 generates the timer start signal $y_2$ of "1".

If the timer start signal $y_2$ is brought into "1", "0" is inputted to the reset input of each of the D-type flipflops $DF_{11}$ to $DF_{1m}$ of the timer 42, so that D-type flipflops $DF_{11}$ to $DF_{1m}$ are released from the reset condition. At this time, since the key input valid signal $y_1$ is of "0", the output $[x_1 \oplus y_1]$ of the exclusive-OR circuit $T_4$ becomes "1". Thus, the signal of "1" is applied to the first stage flipflop $DF_{11}$ of the timer 42, so that it is successively shifted through the cascaded flipflops $DF_{11}$ to $DF_{1m}$ in synchronism with the clock signal $CLK_1$.

When the time $t_{ms}$ has elapsed, the timer out signal $x_3$ of "1" is outputted from the non-inverted output Q of the flipflop $DF_{1m}$. Namely, the circuit is maintained in the status $S_1$ until the timer out signal $x_3$ of "1" is outputted from the timer 42 (Transition $TRS_3$).

On the other hand, when the timer out signal $x_3$ of "1" is outputted from the timer 42, the status is changed to the status $S_2$ (Transition $TRS_4$).

When it is in the status $S_2$, the output variable circuit 44 outputs the key input valid signal $y_1$ of "1" and the timer start signal $y_2$ of "0", respectively. In response to the key input valid signal $y_1$ of "1", the output circuit 30 latches the output of the decoder 20 and outputs the latched signal to the processor not shown.

If the single key depression signal $x_1$ is of "1", since there is not set a condition for the case in which $x_1 \cdot \overline{a_1} \cdot \overline{a_2} \cdot \overline{a_3}$ is "1", the outputs of all the NAND circuits $N_1$ to $N_8$ are brought into "1", so that all the NAND circuits $N_{11}$ to $N_{13}$ outputs "0". Therefore, the status $S_2$ does not change (Transition $TRS_5$).

In the status $S_2$, if the single key depression signal $x_1$ is brought into "0", since $\overline{x_1} \cdot \overline{a_1} \cdot a_2 \cdot \overline{a_3}$ becomes "1", the output of the NAND circuits $N_3$ assumes "0". As a result, the output of the NAND circuit $N_{13}$ is brought into "1", so that "1" is latched in the flipflop $DF_{23}$ in synchronism to the clock $CLK_2$. Accordingly, the status signal $a_1$, $a_2$ and $a_3$ are rendered to "0", "1" and "1", respectively. Namely, the status $S_3$ is realized (Transition $TRS_6$).

Further, the succeeding operation will be explained, but a detailed description will be omitted since a detailed operation would be understood to persons skilled in the art from the above mentioned explanation and FIG. 4 and TABLES 5 and 6.

In the status $S_3$, the output variable circuit 44 maintains the key input valid signal $y_1$ of "1" without changing from status $S_2$, but brings the timer start signal $y_2$ into "1". Before the timer start signal $y_2$ is brought into "1", the timer 42 is put in a reset condition and therefore the inputs $T_1$, $T_2$ and $T_3$ are of "0", "0" and "0", respectively. Namely, the status $S_3$ is maintained (Transition $TRS_7$). The timer 42 outputs the timer out signal $x_3$ of "1" after the time $t_{ms}$.

In the Transition $TRS_7$, even if the multi-key depression signal $x_2$ is brought into "1", the status $S_3$ will not change (Transition $TRS_8$). Only after the timer out signal $x_3$ is changed to "1", the status is changed. When the timer out signal $x_3$ is of "1", if the multi-key depression signal $x_2$ is of "0", it is shifted to the status $S_0$ (Transition $TRS_{10}$). If the multi-key depression signal $x_2$ is of "1", it is shifted to the status $S_4$ and the key input valid signal $y_1$ and the timer start signal $y_2$ are brought into "0" (Transition $TRS_{11}$). Namely, even if the multi-key depression signal $x_2$ becomes "1", if it is shorter than the time $t_{ms}$, it is deemed as being noise, and if it is longer than the time $t_{ms}$, the single key depression signal $x_1$ is invalidated.

In the status $S_3$, if the single key depression signal $x_1$ is brought into "1" before the timer out signal $x_3$ is outputted, the input $T_1$, $T_2$ and $T_3$ of the toggle flipflop circuit 43 are made to "0", "0" and "1", respectively. As a result, the status $S_3$ is brought into the status $S_2$ and the timer start signal $y_2$ is rendered "0" (Transition $TRS_9$). Namely, if the chattering occurs in the status $S_3$, it is returned to the status $S_2$.

In the status $S_4$, this status is maintained until both of the single key depression signal $x_1$ and the multi-key depression signal $x_2$ are returned to "0" (Transition $TRS_{12}$ and $TRS_{13}$). When both of these signals are returned to "0", the status in changed to the status $S_0$ (Transition $TRS_{14}$).

As seen from the above, the chattering prevention circuit 40 includes the status variable circuit 41 which assumes any one of the first to fifth status $S_0$, $S_1$, $S_2$, $S_3$ and $S_4$, on the basis of the single key depression signal $x_1$ and the multi-key depression signal $x_2$ from the decoder 20 and the timer out signal $x_3$ from the timer 42. In response to the status of the status variable circuit 41, the output variable circuit 44 selectively activates or inactivates the key input valid signal $y_1$ and the timer start signal $y_2$. The chattering prevention circuit 40 allows to output circuit 30 to latch the output of the decoder 20 only when the second status is changed to the third status. As a result, an error operation caused at the rising edge of the key signal is prevented. In addition, after it is put in the fourth status, it is allowed to be returned to the first or fifth status only when both of the single key depression signal $x_1$ and the multi-key depression signal $x_2$ are made inactive after the time $t_{ms}$. Therefore, an error operation caused at the falling edge of the key signal is prevented.

The invention has thus been shown and described with reference to the specific embodiments. However, it should be noted that the present invention is in no way limited to the details of the illustrated structures but changes and modifications may be made within the scope of the appended claims.

I claim:

1. An input key apparatus comprising:
a keyboard including a plurality of keys and generating key signals when keys are pressed;
a key input decoder receiving the key signals from the keyboard for generating decoded key signals, the key input decoder generating a single key depression signal when a key of the keyboard is pressed one time, and a multi-key depression signal when two or more keys of the keyboard are simultaneously pressed;
a chattering prevention circuit receiving the single key depression signal and the multi-key depression signal for determining on the basis of the received signals whether or not the key signal received by the decoder is valid, for the purpose of generating a key input valid signal; and
an output circuit receiving the decoded key signal for latching the decoded key signal in response to the key input valid signal;
wherein the chattering prevention circuit includes;
a timer starting its operation in response to a timer start signal for generating a timer out signal after a predetermined time;
a status variable circuit which assumes any one of first to fifth status on the basis of the single key depression signal and the multi-key depression signal from the decoder and the timer out signal from the timer, the status variable circuit outputting status information indicative of which status the status variable circuit is in, the status variable circuit being put in a first status when the apparatus is powered on, the status variable circuit operating to shift from the first status to a second status if the single key depression signal is made active when it is in the first status, the status variable circuit also operating to return to the first status if the single key depression signal is made inactive before the timer out signal is made active, but to shift to a third status if the timer out signal is made active while the single key depression signal is maintained in the active condition, the status variable circuit also operating to shift to a fourth status if the single key depression signal is made inactive after the circuit is in the third status, the status variable circuit also operating to return to the third status if the single key depression signal is made active before the timer out signal is made active and after the circuit has been put in the fourth status, but to respond to a variation of the multi-key depression signal, the status variable circuit also operating to shift to the first status if both of the single key depression signal and the multi-key depression signal are made inactive after the active timer out signal is outputted, but to shift to a fifth status if the single key depression signal is made inactive but the multi-key depression signal is active after the active timer out signal is outputted, the status variable circuit also operating to maintain the fifth status until both of the single key depression signal and the multi-key depression signal are made inactive after the circuit has been put in the fifth status, and to thereafter shift to the first status; and
an output variable circuit in response to the status information from the status variable circuit to selectively activate the key in put valid signal so as to allow the output circuit to latch the output of the decoder only when the second status is changed to the third status whereby an error operation which would be caused at a rising edge of the key signal is prevented, the output variable circuit also operating to control the status variable circuit so as to return the status variable circuit to the first or fifth status after it is put in the fourth status and only when both of the single key depression signal and the multi-key depression signal are made inactive after the predetermined time, so that an error operation which would be caused at a falling edge of the key signal is prevented.

2. An input key apparatus comprising:
a keyboard including a plurality of keys and generating key signals when keys are pressed;
a key input decoder receiving the key signals from the keyboard for generating decoded key signals, the key input decoder generating a single key depression signal when a key of the keyboard is pressed one time, and a multi-key depression signal when two or more keys of the keyboard are simultaneously pressed;
a timer cleared in response to an inactive timer start signal and put in operating condition when the timer start signal is made active, for starting its operation in response to an exclusive-OR of the single key depression signal and a key input valid signal to generate a timer out signal after a predetermined time;

a status variable circuit receiving the single key depression signal, the multi-key depression signal and the timer out signal and capable of assuming any one of first to fifth status on the basis of the single key depression signal, the multi-key depression signal and the timer out signal from the timer, the status variable circuit being put in a first status when the apparatus is powered on, the status variable circuit operating to shift from the first status to a second status if the single key depression signal is made active when it is in the first status, the status variable circuit also operating to return to the first status if the single key depression signal is made inactive before the timer out signal is made active, but to shift to a third status if the timer out signal is made active while the single key depression signal is maintained in the active condition, the status variable circuit also operating to shift to a fourth status if the single key depression signal is made inactive after the circuit is in the third status, the status variable circuit also operating to return to the third status if the single key depression signal is made active before the timer out signal is made active and after the circuit has been put in the fourth status, but to respond to a variation of the multi-key depression signal, the status variable circuit also operating to shift to the first status if both of the single key depression signal and the multi-key depression signal are made inactive after the active timer out signal is outputted, but to shift to a fifth status if the single key depression signal is made inactive but the multi-key depression signal is active after the active timer out signal is outputted, the status variable circuit also operating to maintain the fifth status until both of the single key depression signal and the multi-key depression signal are made inactive after the circuit has been put in the fifth status, and to thereafter shift to the first status;

an output variable circuit in response to the status of the status variable circuit to inactivate the key input valid signal and the timer start signal when the status variable circuit is in the first status, and to bring the key input valid signal and the timer start signal into an inactive condition and into an active condition, respectively when the status variable circuit is in the second status, the output variable circuit operating to bring the key input valid signal and the timer start signal into an active condition and into an inactive condition, respectively when the status variable circuit is in the third status, and to bring both of the key input valid signal and the timer start signal into an active condition when the status variable circuit is in the fourth status, the output variable circuit operating to bring both of the key input valid signal and the timer start signal into an inactive condition when the status variable circuit is in the fifth status; and an output circuit receiving the decoded key signals for latching the decoded key signal in response to the key input valid signal.

3. An input key apparatus comprising:

a keyboard including a plurality of keys and generating key signals when keys are depressed;

a key input decoder receiving the key signals from the keyboard for generating decoded key signals, the key input decoder generating a single key depression signal when only one key of the keyboard is pressed one time, and a multi-key depression signal when two or more keys of the keyboard are simultaneously pressed;

a timer cleared in response to an inactive timer start signal and put in an operating condition when the timer start signal is made active, for starting its operation in response to an exclusive-OR of the single key depression signal and a key input valid signal to generate a timer out signal after a predetermined time;

a status variable circuit receiving the single key depression signal, the multi-key depression signal and the timer out signal and capable of assuming any one of first to third status on the basis of the single key depression signal, the multi-key depression signal and the timer out signal, the status variable circuit being put in a first status when the apparatus is powered on, the status variable circuit operating to shift from the first status to a second status if one of the single key depression signal and the multi-key depression signal is made active when it is in the first status, the status variable circuit also operating to return to the first status if the activated key depression signal is returned to an inactive condition before the timer out signal is made active, but to shift to a third status if the timer out signal is made active while the activated key depression signal is maintained in the active condition, the status variable circuit also operating to return to the first status if both of the single key depression signal and the multi-key depression signal are made inactive after the active timer out signal is outputted;

an output variable circuit in response to the status of the status variable circuit to inactivate the key input valid signal and the timer start signal when the status variable circuit is in the first status, and to bring the key input valid signal and the timer start signal into an inactive condition and into an active condition, respectively when the status variable circuit is in the second status, the output variable circuit also operating to bring the key input valid signal and the timer start signal into an active condition and into an inactive condition, respectively when the status variable circuit is in the third status; and an output circuit receiving the decoded key signals for latching the decoded key signal in response to the key input valid signal, whereby an error operation which would be caused at a rising edge of the key signal is prevented.

* * * * *